United States Patent [19]

King et al.

[11] Patent Number: 5,615,356
[45] Date of Patent: Mar. 25, 1997

[54] METHOD AND APPARATUS FOR INTERACTIVELY DISPLAYING SIGNAL INFORMATION DURING COMPUTER SIMULATION OF AN ELECTRICAL CIRCUIT

[75] Inventors: Edward C. King, Fremont; Alan G. Smith, Pleasanton, both of Calif.

[73] Assignee: CPU Technology, Inc., Pleasanton, Calif.

[21] Appl. No.: 334,769

[22] Filed: Nov. 4, 1994

Related U.S. Application Data

[63] Continuation of Ser. No. 883,584, May 14, 1992, abandoned, which is a continuation-in-part of Ser. No. 871,435, Apr. 21, 1992, abandoned.

[51] Int. Cl.$^6$ .................................................... G06F 15/60
[52] U.S. Cl. ......................... 395/500; 395/141; 364/489; 364/232.3; 364/DIG. 1
[58] Field of Search ................................... 395/500, 141; 364/489, 232.3, DIG. 1

[56] References Cited

U.S. PATENT DOCUMENTS

| | | | |
|---|---|---|---|
| 4,870,561 | 9/1989 | Love et al. | 395/500 |
| 5,051,938 | 9/1991 | Hyduke | 395/500 |
| 5,220,512 | 6/1993 | Watkins et al. | 364/489 |
| 5,282,146 | 1/1994 | Aihara et al. | 364/489 |

*Primary Examiner*—Alyssa H. Bowler
*Assistant Examiner*—John Harrity
*Attorney, Agent, or Firm*—Townsend and Townsend and Crew

[57] ABSTRACT

A computer system simulator concurrently models both processor operation and signal logic behavior and provides a high degree of user interaction and flexibility in the observation and control of signal values and memory contents during the execution of a simulation. During simulation, source equations for signals can be requested for display either through direct input of a signal name or through graphical interface with the simulation display. Signal equations can in this manner be traced back through several levels, which conveniently provides important information during the observation and modification of signal values. Memory areas may be associated with a processor and loaded with data to be executed by that processor during the simulation. The data can be displayed in both numerical and assembly code mnemonic form, and may also be modified by entering numbers or assembly instructions. The simulated processor execution may thus be interactively modified during the simulation. Additionally, the ability to step the simulation backwards through time, and then forward again, is provided.

7 Claims, 10 Drawing Sheets

```
                                    Equations
d:\cti\hms\sim\hmssx\hms_cntr.cd1-hms_hc  ONBOARD
ONBOARD := !BASE_LT & LIMIT_LT & ENCLKAD                      ───○
         # !ENCLKAD & ONBOARD                                    310
         # !NPRIMARYb & !PRIMFF;
d:\cti\hms\sim\hmssx\hms_cntr.cd1-hms_hc  ENCLKAD             ───1
ENCLKAD = PREENCLKAD & (!SETREFRESHREQ # PROCBIB)                325
        # !RESET_L;
```

FIG. 5B

F1: Status     F2: Drop All    F3: List Array   F4: Init Sim    F5: Multi Step
F6: Undo Step  F7: Drop Trace  F8: List All     F9: Add Trace   F10: Single Step
02/05/92 ─── CPU TECHNOLOGY, INC. ─── Simmetry Simulator Version 2.20 Beta ─── 19:20:31

METHOD AND APPARATUS FOR INTERACTIVELY DISPLAYING SIGNAL INFORMATION DURING COMPUTER SIMULATION OF AN ELECTRICAL CIRCUIT

CROSS-REFERENCE TO RELATED APPLICATIONS

This is a Continuation of application Ser. No. 07/883,584, filed May 14, 1992, now abandoned, which application is a continuation-in-part of Ser. No. 07/871,435, filed Apr. 21, 1992 now abandoned.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

SOURCE CODE APPENDICES

Two microfiche appendices of c language source code for a preferred embodiment are filed herewith.

BACKGROUND OF THE INVENTION

This invention relates to the field of computer simulation of electrical systems. Specifically, the invention relates to virtual modeling of computer systems.

Various methods of modelling and simulating computer systems and other electronic systems are well known. Computer system models have generally fallen into one of two classes: processor models, and logic models. Processor models simulate the execution of computer code and are used to debug microcode and other programs before the processor for which they are intended has actually been built. Logic models are bus level simulations that cannot execute code and are instead used to debug the hardware of a system. Prior to the actual simulation, design language source files, commonly in a Hardware Description Language ("HDL"), describing the basic components modeled and a particular configuration are provided as input to a compiler to produce an HDL object file. The HDL object file is then used as input to simulator code which then performs the simulation. Primary features common or similar in both types of modeling are the ability to step through the simulation and to allow signal/waveform values or register/memory contents to be displayed and altered. The interpretation and modification of such displayed waveform values is hampered, however, by the difficulty of associating HDL source code equations with the simulation display. Typically, HDL source code equations must either be read from physical print outs, or from an editor screen on a separate computer (or on a separate window in multitasking environments). Neither of these methods provide any link between the simulation and the source file, complicating the simulation review/modification process.

SUMMARY OF THE INVENTION

Computer system simulation according to the present invention provides a high degree of user interaction and flexibility in the observation and tracing of signal values and source equations during the execution of a simulation. During simulation, source equations for signals can be requested for display either through direct input of a signal name or through graphical interface with the simulation display, such as from a signal value display. Signal equations can in this manner be traced back through several levels, which conveniently provides important information during the observation and modification of signal values.

This interaction is achieved through the steps of processing design language source files to establish a table relating signal names to particular locations within the design language source files at which the signal equations are defined, executing the system simulation, during system simulation execution providing input selecting a signal name for source equation display, matching the selected signal name to an entry in the signal source equation location table, and displaying the source equation indicated by the matching table entry.

A further understanding of the nature and advantages of the invention may be had with reference to the following figures and description.

BRIEF DESCRIPTION OF THE DRAWINGS

FIGS. 5A–B illustrate a simulator screen display of a particular embodiment of the present invention, with signal source equations displayed.

DESCRIPTION OF THE PREFERRED EMBODIMENT

Figure 1:
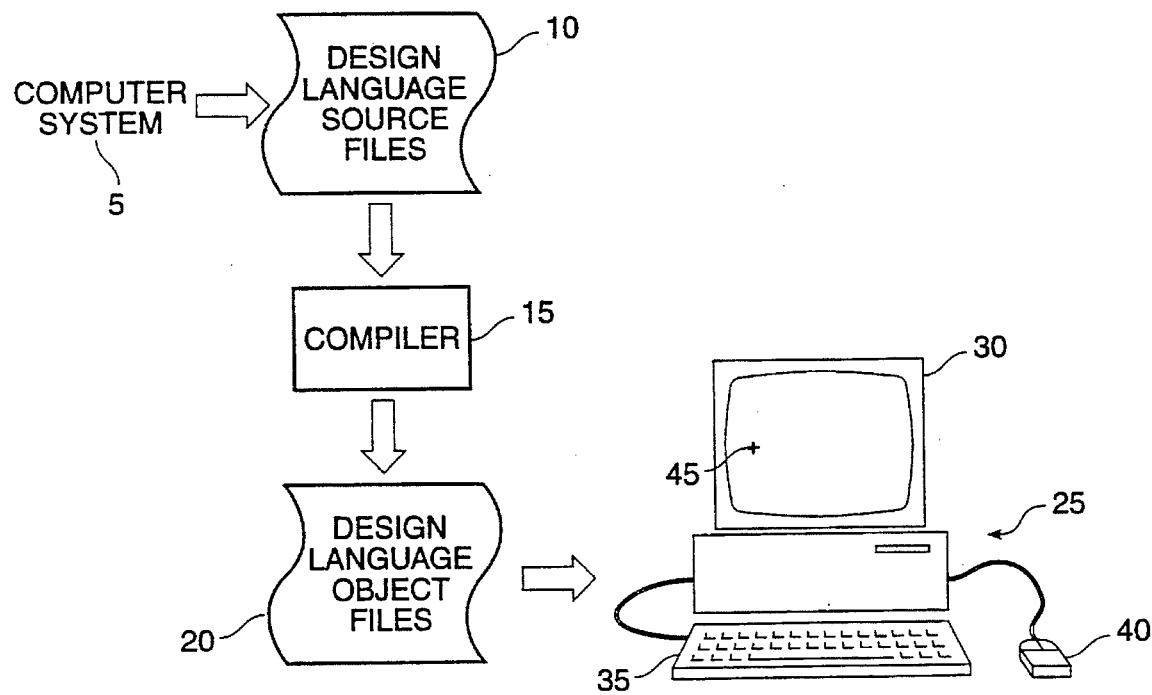
FIG. 1 is a diagram illustrating typical components used for virtual modeling of a computer system.

Illustrated in FIG. 1 are the typical components used for virtual modeling of a computer system. A computer system 5 is represented by design language source files 10. There is a variety of design languages which may be used to describe computer system 5. In a preferred embodiment of the present invention, the Concurrent Design Language ("CDL"), a type of HDL, is employed. CDL is a design language based along hardware lines, as opposed to "VHDL" or "Verilog" which tend to be software oriented, and is specified in the compiler source code of microfiche Appendix A. HDL source files 10 are processed by a compiler 15 to produce HDL object file(s) 20, which contain the actual data structures and software models used by the simulator to perform the simulation. HDL object files 20 are then passed to a simulator, shown here as computer 25 configured with simulator software. Computer 25 comprises display 30, keyboard 35, and mouse 40 controlling cursor 45, which are used to provide information to and receive input from a user during simulation. Frequently, computer 25 will also be configured with compiler software to perform the functions of compiler 15.

Figure 2:
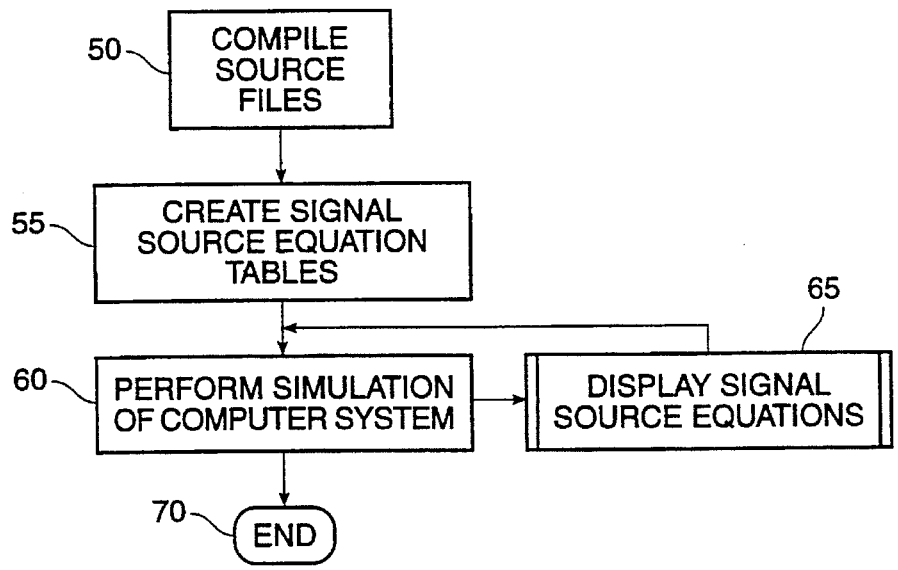
FIG. 2 is a flowchart illustrating major stages of operation of a particular embodiment of the present invention.

Major stages of operation of a particular embodiment of the present invention are illustrated by the flowchart of FIG. 2. The first step, step 50, is to compile the HDL source files 10 to produce HDL object files 20. The second, step 55, is to create signal source equation tables which relate signal names to the locations of their source equations within HDL source files 20. This step is included with the normal compilation of source files 10 in step 50, and the signal source equation tables are included within HDL object files 20. Of course, in other embodiments this information could be processed and stored separately from the main compilation and object files. Next, step 60 is to perform the actual simulation of the computer system described by HDL source files 10. Interlaced with the performance of the simulation in step 60 can be various user commands affecting either the simulation display or even the actual simulation flow. A common one of such commands is to display signal value waveforms during simulation execution. An important feature of the preferred embodiment is the user selection in step 65 of signals for which source equations are to be displayed. Selection may be by manually entering a signal name, or by simply positioning cursor 45 over a displayed signal name and clicking a mouse button. Upon selection of signals in step 65, the signal source equation tables are employed to locate and display the corresponding source equations from HDL source files 10. The user may repeatedly alternate between simulation performance in step 60 and signal source equation selection and display in step 65, until the simulation terminates in step 70.

The ability to interactively select signals for source equation display is a powerful feature which adds a great deal of utility to the performance of a simulation. By itself, it can be important in determining which signals are of importance for observation, and for providing quick reference to the relationships among various signals. Source equation display can also significantly increase the utility of other simulation features. The ability to modify signal values during simulation is a feature present in the prior art, but it is of limited usefulness there because of the inability to retrieve signal source equations during system simulation, so as to be sure of the significance of a particular signal. Furthermore, changing a current value of a combinatorial signal may not have the desired effect because when the simulation is advanced the signal will be updated by its own equation. For less transient changes to signal values, the source equation tracing feature may be employed to trace combinatorial signals to their underlying root signals, the modification of which may have a more lasting effect.

Figure 3A:
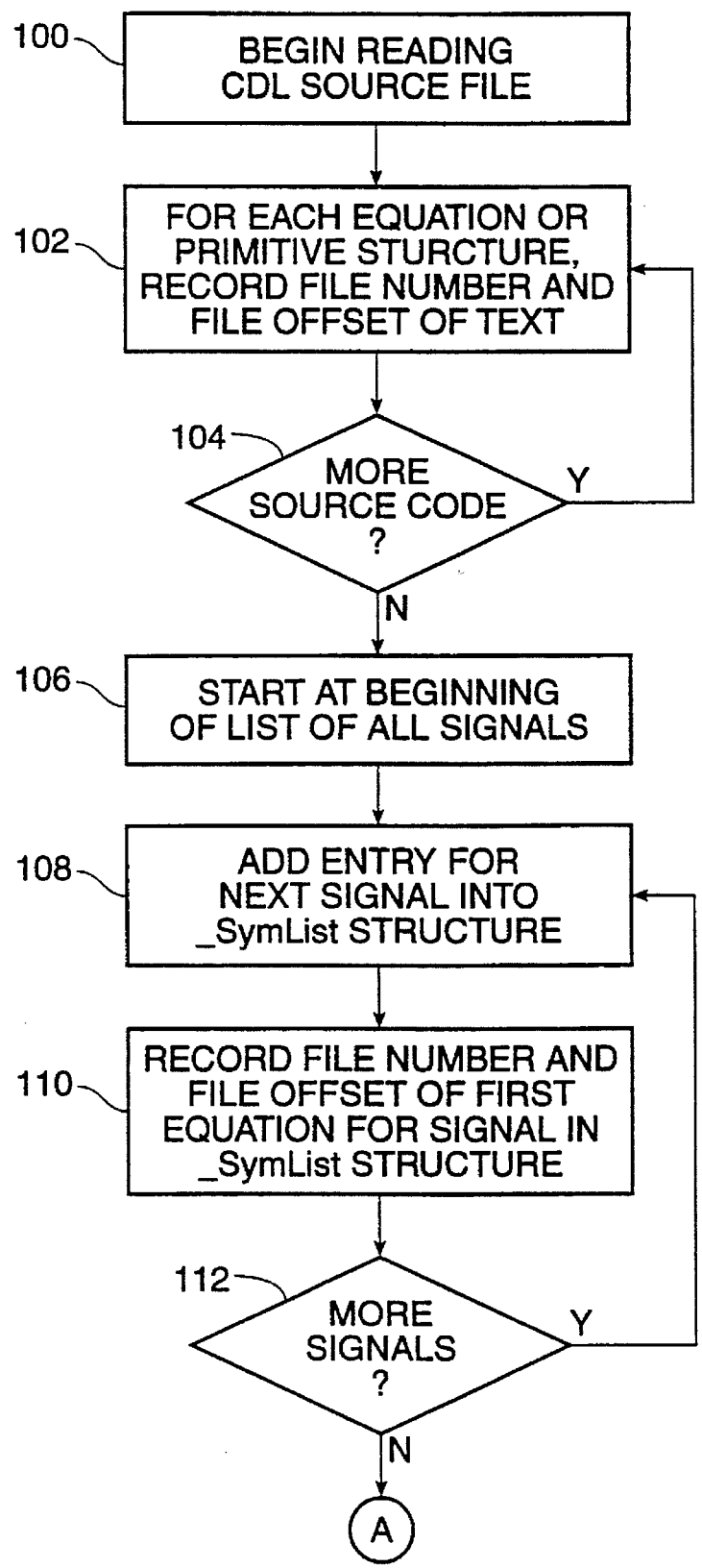
FIGS. 3A and 3B are flowcharts illustrating the creation of signal source equation tables according to a preferred embodiment of the present invention.
Figure 3B:
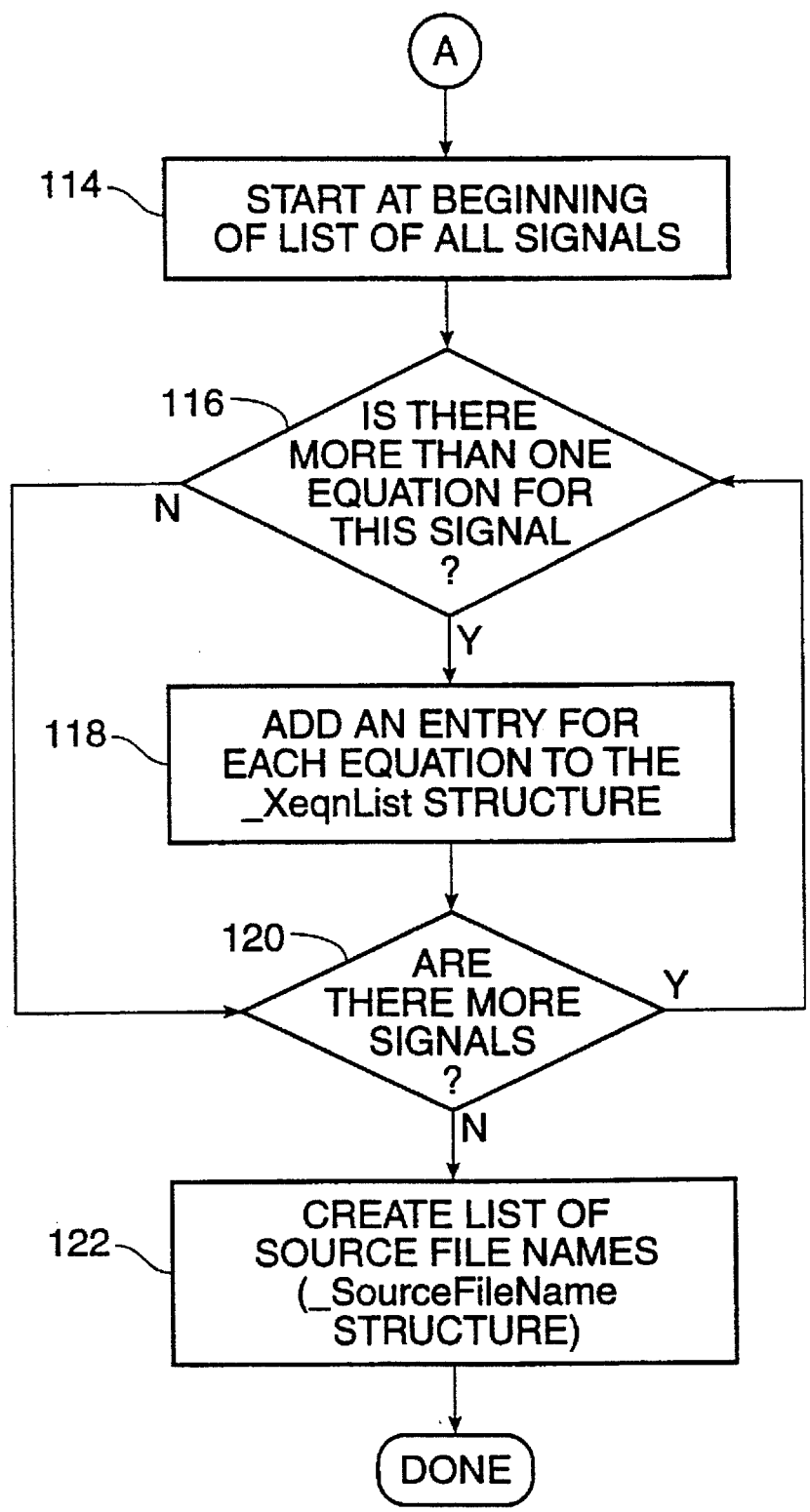

The process of forming the signal source equation location tables is illustrated by the flowcharts of FIGS. 3A–B. This process is performed by the HDL compiler of the preferred embodiment, and produces several particular data structures. The first such data structure is simply a list of the HDL source files specifying signals for the modeled system, in which each entry is simply a character string specifying a filename. The next data structure is a primary list of signals, in which each entry includes the signal name string, the width of the signal in bits, the file number of the source file specifying the signal (where the file number indicates the file index within the list of source files), and the offset within that file at which the signal is specified. Another special data structure used by this process is a secondary list of signals, for those defined by more than one equation, which can occur if a signal is defined by distinct equations for different bit ranges, or if any bits are driven by tri-state buffers. Each entry of this list is for a particular defining equation and includes the signal name, the range of bits defined by the particular equation, and the equations file number and file offset.

The process begins at block 100 of FIG. 3A, in which the compiler reads a portion of the first HDL source file. Next, at block 102, if this portion of the source file defines a signal equation or a primitive structure (which typically contain several signals), the compiler adds a record to a preliminary list of signal definitions, noting the signal name, file number, and of the offset within the file of the text specifying the signal. In block 104 it is next determined whether any source code remains to be processed. If the current file contains more text, or if more files remain, the block 102 is repeated for a new portion of source code.

Once all of the source code has been processed, control passes from block 104 to block 106, in which the compiler starts at the beginning of the preliminary list of signal definitions, to begin the sub-process of forming the primary signal list. This sub-process is described in blocks 108, 110, and 112. In block 108 an entry for the next signal is added along with the signal width to the primary signal list. Next, in block 110, the file number and file offset of the first equation for that signal are added to the signal entry in the primary signal list. Next, in block 112, it is determined if more signals remain. If so, the next signal is processed in block 108. I no more remain, then the primary signal list has been created, and the process continues as shown in FIG. 3B, where indicated by point "A".

In FIG. 3B is shown the sub-process of constructing the secondary signal list, for signals having multiple equations. Block 114 indicates that the compiler starts at the beginning of the preliminary signal list. Next, in block 116, the compiler examines the current signal and determines whether it is defined by more than one equation. If so, then in block 118 the compiler adds an entry to the secondary signal list for each equation for the signal. If the signal is defined by only one equation, block 118 is simply skipped over. Following block 118 is block 120, in which the compiler determines whether any signals remain to be processed. If any do, then the procedure is repeated at block 116 for the next signal. Otherwise, the compiler continues on to block 122 and the list of source language filenames along with the primary and secondary signal lists, are then written to an HDL object file for use by the simulator in performing step 65 of FIG. 2.

The simulator procedures for displaying signal source equations are illustrated in FIGS. 4A–E. The main loop of this procedure is diagrammed by the flow chart of FIG. 4A. In block 200, the user activates the draw equation function. This can be done by pressing a particular function key of keyboard 35, or by using mouse 40 in a well known manner to select a signal name displayed on screen 30 and click thereupon. After this function is activated, the simulator determines the signal name for display. If a mouse click was used to activate the function, the signal name(s) is the currently selected text; otherwise, the user is prompted for the signal name or a list of signals. The simulator next determines in block 204 whether sufficient space remains in an equation display buffer. If this test fails, then the function terminates. If there is sufficient space, then the simulator continues to block 206, where the display equation routine is called for the current signal. The operation of the display equation routine is explained in detail with reference to FIGS. 4B–E. After the display equation routine has been called, the simulator determines in block 208 if the are any more signals remaining for equation display. An affirmative determination results in a repeat of block 206 for the next signal. Once all of the new signals have been processed by the display equation routine, at block 210 the equation buffer is written to the screen for viewing by the user, and the normal simulation operation continues.

Figure 4A:
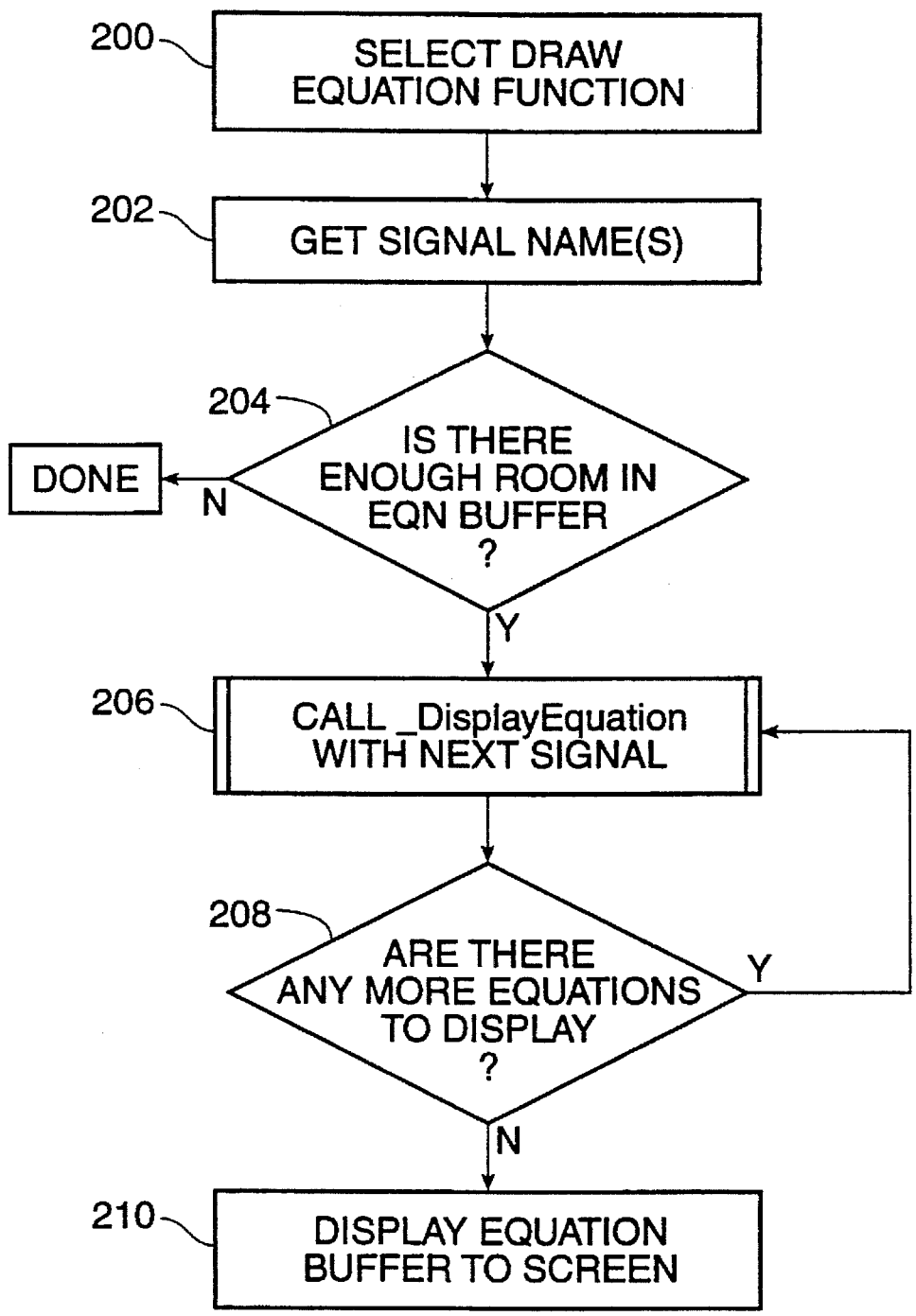
FIGS. 4A–4E are flowcharts illustrating the display of signal source equations according to a preferred embodiment.
Figure 4B:
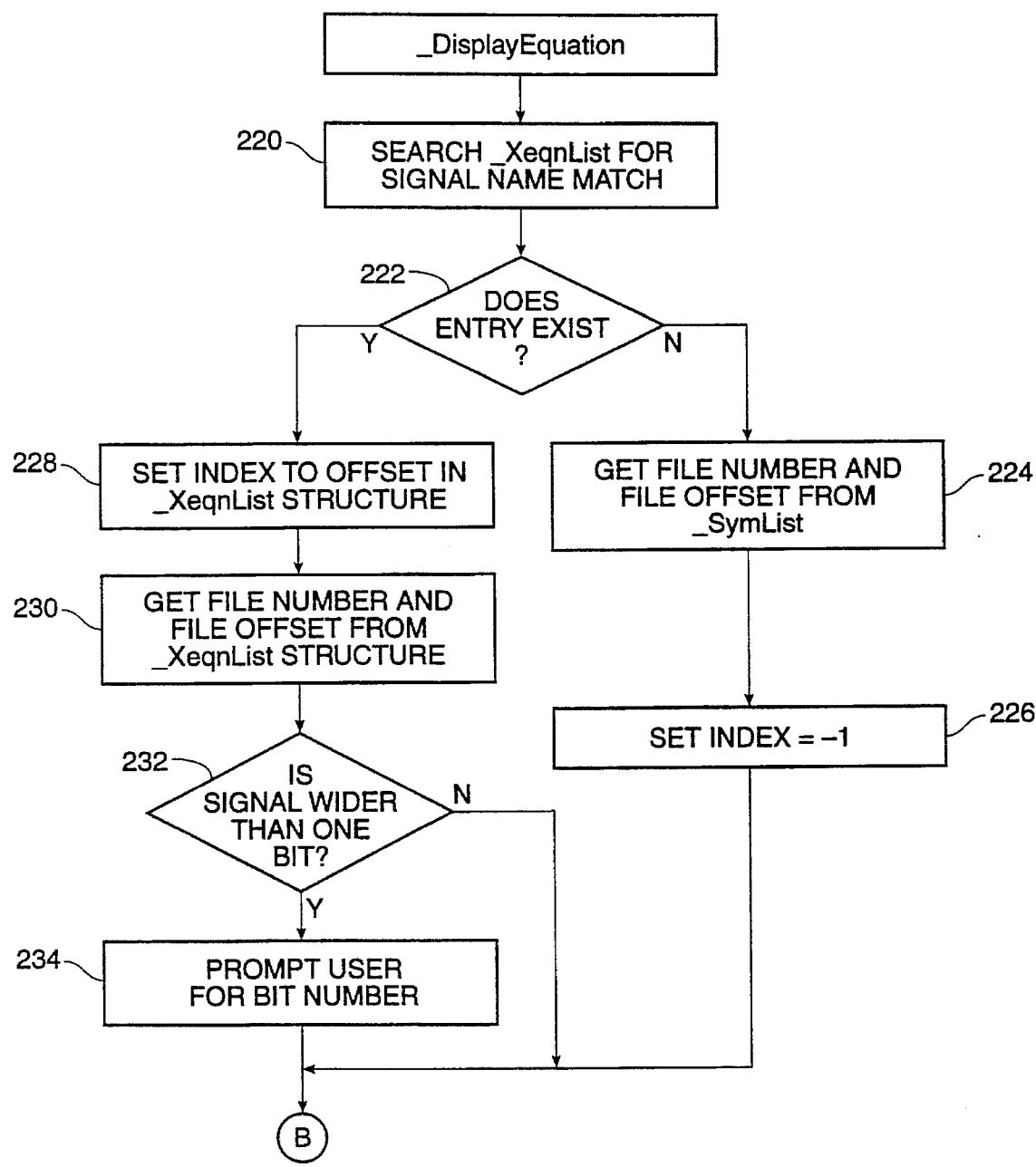
Figure 4C:
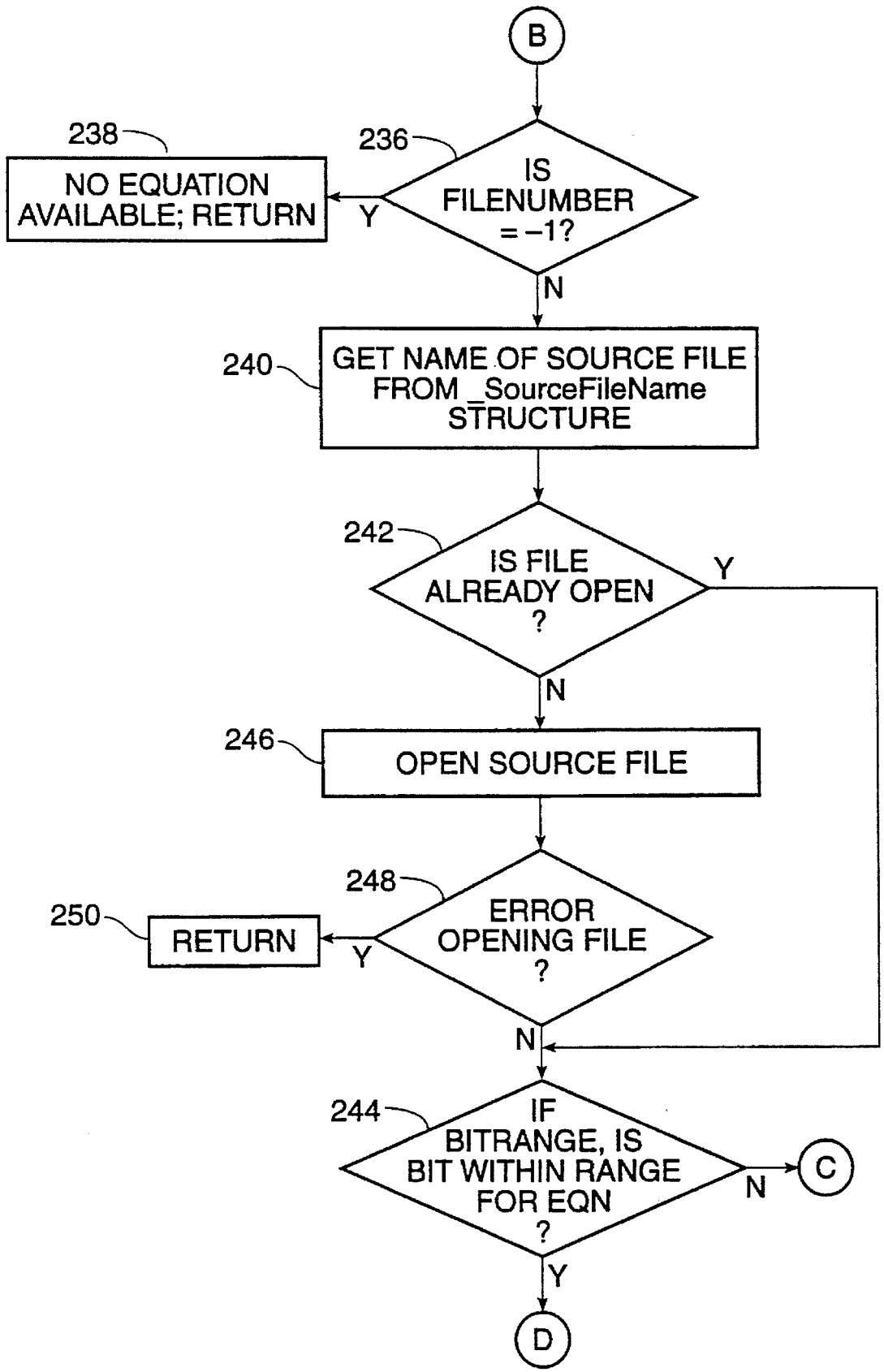

When the display equation routine is called in block 206, it is supplied a signal name and performs the procedures illustrated in FIGS. 4B–E. First, in block 220, the simulator searches the secondary signal list for a match to the provided signal name to determine if this signal has multiple source equations. If block 222 determines that there is no match, then in block 224 the simulator matches the signal name to an entry in the primary signal list and retrieves the file number and offset. If no match is found the file number is set to −1 as an error flag. Next, a secondary equation list index is set to minus one (there is no entry) in block 226, and execution continues as shown in FIG. 4C where indicated by reference "B". If the signal name was matched to a secondary signal list entry in block 222, then at that point the simulator proceeds to block 228 and sets the secondary equation list index to the first location in the secondary equation list at which the signal name matched. Next in block 230, the file number, offset, and equation bit range are retrieved from this entry, and the signal width is read from the corresponding entry in the primary signal list. If the simulator next determines in block 232 that the signal is wider than one bit, the user will be prompted for a desired bit range at block 234 before continuing as shown by reference "B". This bit range selection defaults to the full signal width if the user simply hits the <return> key when prompted for a range.

As shown by reference "B" in FIG. 4C, the simulator next determines in block 236 if the current file number is equal to the error flag value of −1. If so, then no equation is available and the procedure terminates at block 238. If a proper file number is present, then in block 240 the source file name is retrieved and in block 242 it is determined if the file is already open. If the file is open, control skips ahead to block 244, otherwise, in block 246 the simulator attempts to open the file. If a file opening error is detected in block 248, then in block 250 the procedure terminates. If the file opens properly, in block 244 the simulator determines if the bit range of the current equation is within the bit range selected by the user. If not, then control passes as shown by reference "C". If the current bit range is within the selected bit range, control passes as indicated by reference "D".

Figure 4D:
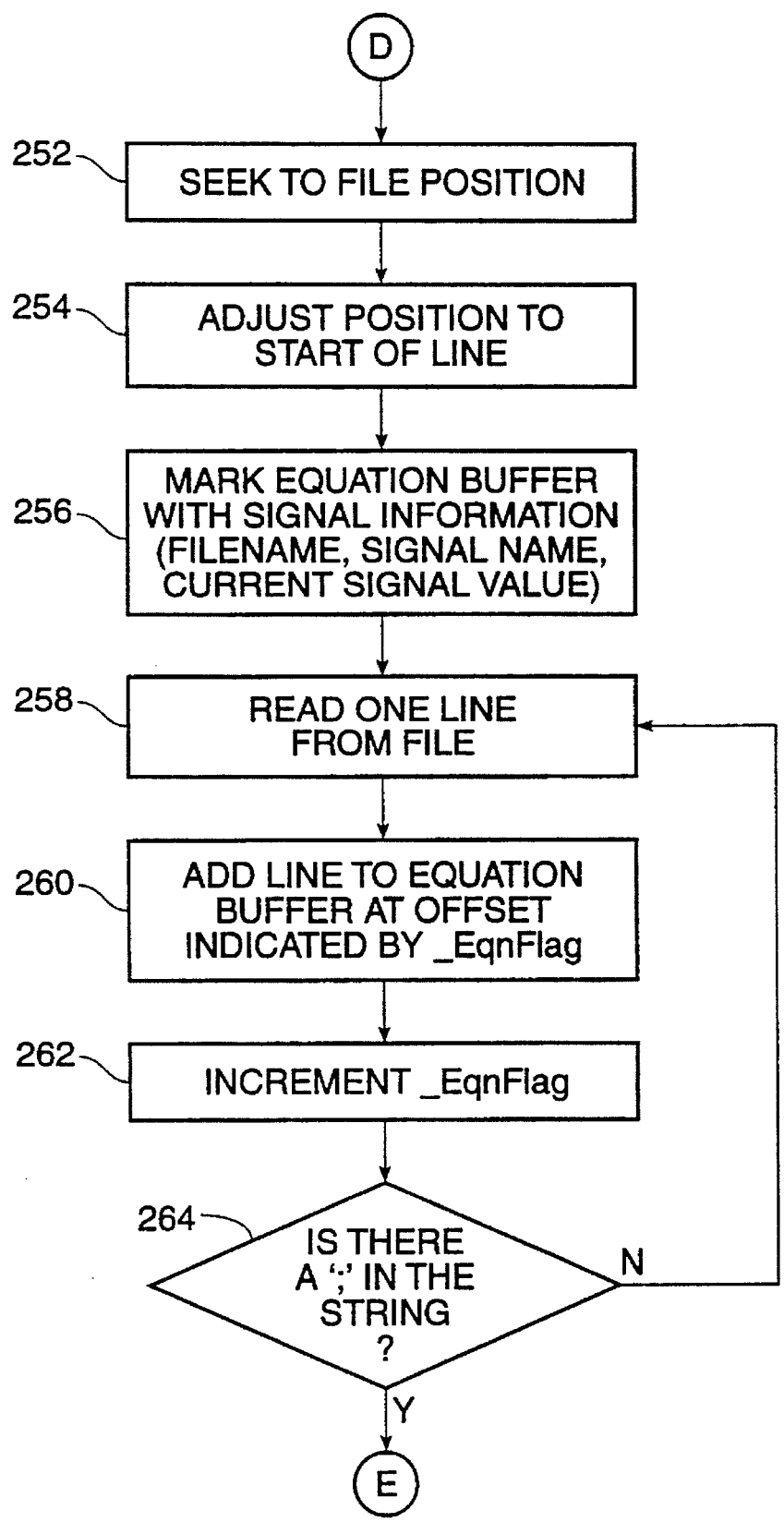

In FIG. 4D, reference "D" indicates control to pass to block 252 followed by block 254, in which the file offset of the current equation is used to position file access to the start of the text line containing the current source equation. Continuing in block 256, the simulator records the signal definition filename, the signal name, and the current signal value in the equation buffer. Next, the simulator reads a text line from the signal source file in block 258, and in block 260 this line is added to the equation buffer at the offset point indicated by the current equation buffer index (initially pointing to the start of the equation buffer). Following this, in block 262 the equation buffer index is incremented, and in block 264 the current line is examined for the presence of a semicolon. The semicolon is used as a signal definition terminator, and its absence indicates that the current signal equation has further text. If a semicolon is not found, control loops back to block 258, where the next line is read. Once all of the lines of the equation have been read, control passes from block 264 as indicated by reference "E".

Figure 4E:
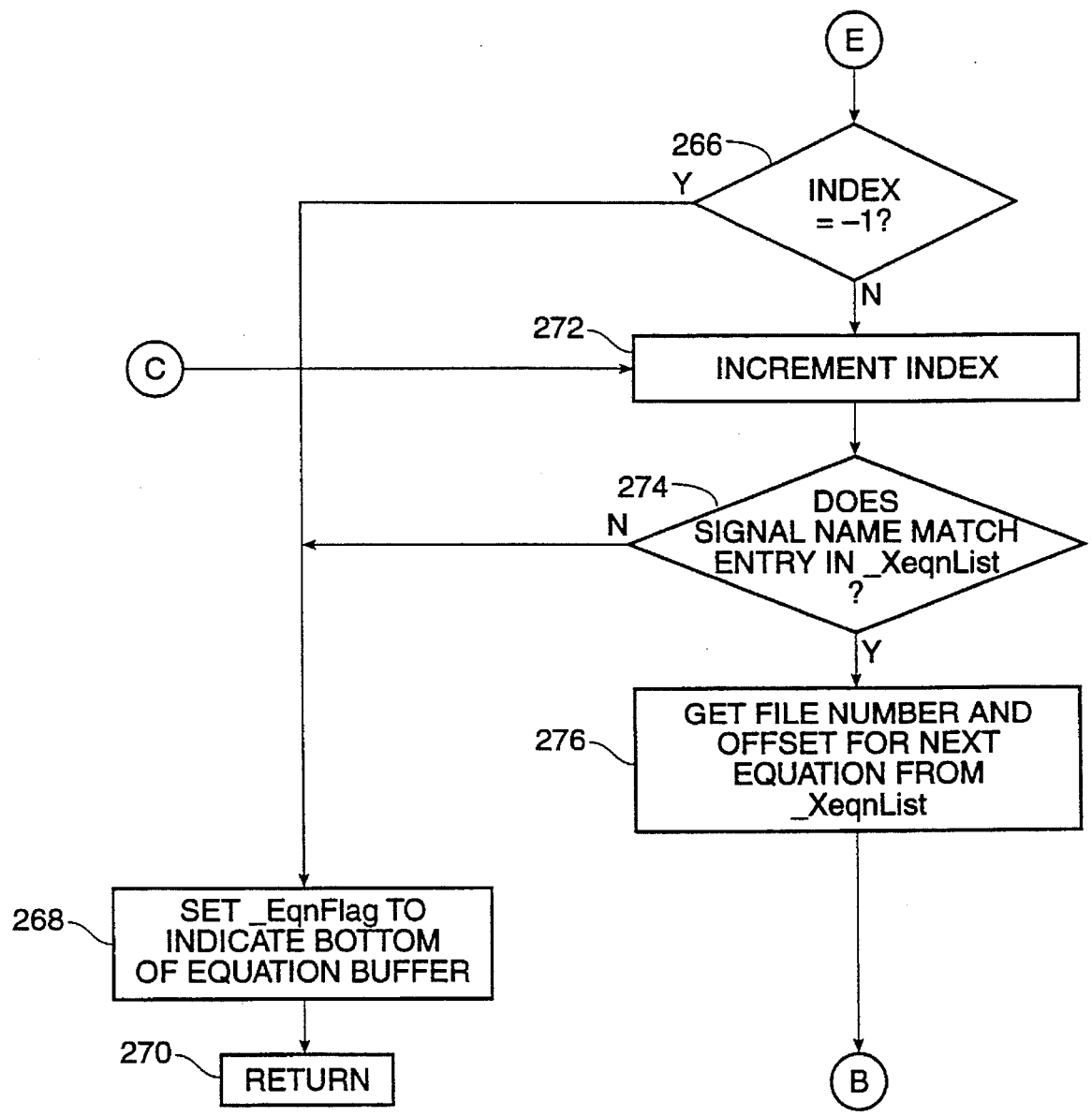

In FIG. 4E, reference "E" indicates block 266, in which it is determined whether the secondary equation list index is equal to minus one, which is a flag indicating whether the current signal has multiple defining equations. If this index is equal to minus one, control passes to block 268; otherwise, the secondary equation list index is incremented in block 272, which is also the transfer destination indicated by reference "C". Following block 272, the signal name of the entry pointed to by the new value of the secondary equation list index is examined. If the signal name of the entry matches the current signal name, the another equation remains for display. In this case in block 276 the simulator retrieves the file number and offset for this next equation and control passes as indicated by reference "B". If it was determined in block 274 that no more equations remain for the current signal, the control passes from there to block 268. In block 268 the equation buffer index is set to indicate the bottom of the equation buffer, after which in block 270 the display equation routine terminates and returns to the process illustrated in FIG. 4A.

Figure 5A:
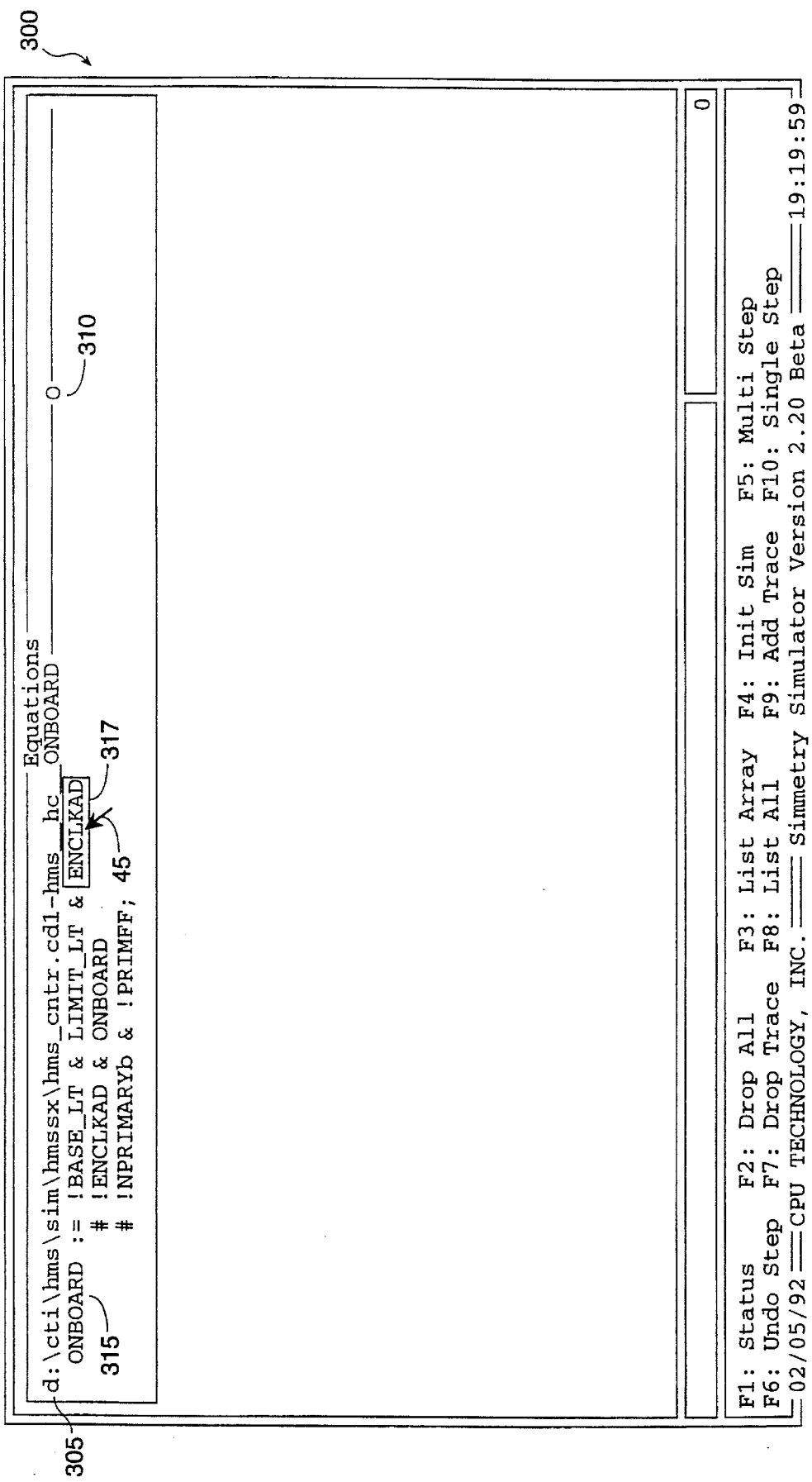

An example of a simulator screen after signal source equations have been displayed by the above process is shown in FIGS. 5A–B. In FIG. 5A the equation for the signal ONBOARD is displayed on the simulator screen, which is indicated generally by reference numeral 300. Typically, a variety of signal waveforms and other parameters would also be displayed upon screen 300 as well. As described above, the source equation filename, current value, and source equation for ONBOARD are displayed, reference numerals 305, 310, and 315, respectively. One of the signals in the boolean equation defining ONBOARD i.e. "ONBOARD"="BASE_LT" & "LIMIT_LT" & "ENCLKAD") the signal ENCLKAD indicated by reference numeral 317, is highlighted and pointed to by cursor 45. To see the source equations for ENCLKAD the user clicks on the selected text, resulting in the display of FIG. 5B. In FIG. 5B, the source filename, current value, and source equation for ENCLKAD are also displayed, reference numerals 320, 325, and 330, respectively. In a similar manner, the user could trace these signal definitions to their base signals in order to fully monitor their operation.

Additional Features

As detailed in the source code appendices, the simulator of the preferred embodiment also provides a high degree of user interaction and flexibility in the observation and control of memory contents during the execution of a simulation. Memory areas may be associated with a processor and loaded with data to be executed by that processor during the simulation. The data can be displayed in both numerical and assembly code mnemonic form, and may also be modified by entering either numbers or assembly instructions. The simulated processor execution may thus be interactively modified during the simulation. Additionally, the ability to step the simulation backwards through time, and then forward again, is provided.

Conclusion

The invention disclosed herein provides a substantially improved method and apparatus for interactively performing virtual modeling of computer systems. It is to be understood that the above description is intended to be illustrative and not restrictive. Many embodiments will be apparent to those of skill in the art upon reviewing the above description. The scope of the inventions should, therefore, be determined not with reference to the above description, but should instead be determined with reference to the appended claims, along with the full scope of equivalents to which such claims are entitled.

What is claimed is:

1. A method of simulating an electronic system with interactive control of a simulation display, said electronic system including an electrical conductor and a first signal applied to the conductor, said first signal comprising a plurality of bits, said method comprising the steps of:

a) providing at least one design language source file describing said electronic system, said at least one design language source file comprising a plurality of definition equations defining said first signal, each of said plurality of definition equations defining a respective range of bits of said first signal;

b) compiling said at least one design language source file to form a design language object file;

c) invoking a simulator with said design language object file, whereby said electronic system is simulated and simulation information is displayed upon a simulation screen;

d) concurrently with said simulating of said electronic system, selecting by user inputs a desired range of bits of said first signal for definition display; and e) displaying only those of said plurality of definition equations defining a range of bits which overlaps said desired range of bits on said simulation screen concurrently with said simulating of said electronic system.

2. The method of claim 1, wherein a particular one of said definition equations displayed in step (e) includes a second signal, said at least one design language source file comprising a definition equation of said second signal, said method further comprising the steps of:

f) concurrently with said simulating of said electronic system, selecting said second signal from said particular displayed definition equation of said first signal; and g) displaying said definition equation of said second signal on said simulation screen concurrently with said simulating of said electronic system.

3. The method of claim 1, wherein said selecting step comprises graphically selecting an item of said displayed simulation information.

4. The method of claim 3, wherein said displayed simulation information comprises a signal name label, and wherein said selecting step comprises selecting said signal name label with a mouse.

5. The method of claim 1, wherein the electrical system is a digital system further including a processor and a bus.

6. The method of claim 1, wherein one of said plurality of definition equations defines the first signal as a boolean equation.

7. The method of claim 1, wherein the desired range of bits is the entire plurality of bits of the first signal.

* * * * *